United States Patent [19]
Guilford et al.

[11] Patent Number: 4,716,364
[45] Date of Patent: Dec. 29, 1987

[54] MONITORING TRANSIENTS IN LOW INDUCTANCE CIRCUITS

[75] Inventors: Richard P. Guilford; John R. Rosborough, both of Albuquerque, N. Mex.

[73] Assignee: The United States of America as represented by the United States Department of Energy, Washington, D.C.

[21] Appl. No.: 789,892

[22] Filed: Oct. 21, 1985

[51] Int. Cl.$^4$ .................. G01R 1/20; G01R 19/00; H01F 27/28
[52] U.S. Cl. .................. 324/127; 324/102; 336/200
[58] Field of Search .......... 324/127, 102, 117 R; 336/200, 173

[56] References Cited

U.S. PATENT DOCUMENTS

| | | | |
|---|---|---|---|
| 2,396,764 | 3/1946 | Waldvogel | 324/127 |
| 3,374,434 | 3/1968 | Perry | 324/127 |
| 3,377,551 | 4/1968 | Le Doux | 324/51 |
| 3,419,791 | 12/1968 | Mishkovsky | 324/127 |
| 3,434,052 | 3/1969 | Fechant | 324/127 |
| 3,465,274 | 9/1969 | Proctor | 324/260 |
| 3,467,864 | 9/1969 | Vander | 324/117 R |
| 3,518,544 | 6/1970 | Tachick | 324/133 |
| 3,524,133 | 8/1970 | Arndt | 324/133 |
| 3,816,816 | 6/1974 | Schweitzer, Jr. | 324/133 |
| 3,876,911 | 4/1975 | Schweitzer, Jr. | 324/133 |
| 3,962,694 | 6/1976 | Calia et al. | 340/635 |
| 3,986,115 | 10/1976 | Huang | 324/133 |
| 3,986,116 | 10/1976 | Smith et al. | 324/127 |
| 4,012,703 | 3/1977 | Chamberlayne | 336/200 |
| 4,180,775 | 12/1979 | Hsieh | 324/117 R |
| 4,424,512 | 1/1984 | Schweitzer, Jr. | 324/133 |
| 4,438,403 | 3/1984 | Schweitzer, Jr. | 324/133 |
| 4,471,355 | 9/1984 | Hardy et al. | 324/96 |

*Primary Examiner*—Ernest F. Karlsen
*Attorney, Agent, or Firm*—George H. Libman; Judson R. Hightower

[57] ABSTRACT

A pair of flat cable transmission lines are monitored for transient current spikes by using a probe connected to a current transformer by a pickup loop and monitoring the output of the current transformer. The approach utilizes a U-shaped pickup probe wherein the pair of flat cable transmission lines are received between the legs of the U-shaped probe. The U-shaped probe is preferably formed of a flat coil conductor adhered to one side of a flexible substrate. On the other side of the flexible substrate there is a copper foil shield. The copper foil shield is connected to one end of the flat conductor coil and connected to one leg of the pickup loop which passes through the current transformer. The other end of the flat conductor coil is connected to the other leg of the pickup loop.

10 Claims, 6 Drawing Figures

| TYPE SYSTEM | R | X | Z | L |
|---|---|---|---|---|
| FLAT CABLE ONLY | .074Ω | .193Ω | .207/69°Ω | 12.3nh |
| T & M MODEL SDN-414-01 CVR | .087Ω | .345Ω | .356/75.8°Ω | 21.9nh |
| PEARSON MODEL 411 CVT | .091Ω | .676Ω | .682/82.3°Ω | 43nh |
| PICKUP LOOP MONITOR SYSTEM | .074Ω | .194Ω | .208/69.1°Ω | 12.3nh |
| RESULTS: CVR ADDED .013Ω & 9.6nh TO CABLE Z    CVT ADDED .017Ω & 30.7nh TO CABLE Z | | | | |

MONITORING TRANSIENTS IN LOW INDUCTANCE CIRCUITS

The U.S. Government has rights in this invention pursuant to Contract No. DE-AC04-76DP00789 between the U.S. Department of Energy and AT&T Technologies, Inc.

BACKGROUND OF THE INVENTION

1. Field of the Invention

The instant invention relates to methods of and apparatus for monitoring transients in low inductance circuits and to a probe utilized to practice said method and apparatus. More particularly, the instant invention relates to methods of and apparatus for monitoring low inductance circuits, wherein the low inductance circuits include a pair of flat cable transmission lines. The instant invention is further directed to a probe for use in monitoring pairs of flat cable transmission lines.

2. Technical Considerations and Prior Art

Computers and other electronic equipment are sensitive to transient voltages and currents which can cause malfunctions. Accordingly, there is a need to constantly monitor circuits for high current transient waveforms. Conventional methods for measuring high current transient waveforms associated with low inductance circuits, such as those associated with capacitor discharge units, either utilize current viewing resistors which introduce unwanted ground points or require passing current to be measured through a current viewing transformer, which results in the introduction of unwanted additional inductance into the circuit. Low inductance, high current circuits often use flat cable transmission lines, which when surrounded by a magnetic core carrying an auxiliary winding introduce substantial additional impedance in the circuits.

The prior art includes a number of patents directed to monitoring circuits for transients. However, all of these patents have deficiencies when used to monitor transients in low inductance, high current circuits using flat cable transmission lines. For example, U.S. Pat. Nos. 3,876,911; 4,424,512; and 4,438,403 each use reed switches to monitor circuits for transient spikes. However, none of these patents provide an analog output and all of these patents are limited to rather low frequencies of operation and therefore do not effectively respond to frequencies greater than one kilohertz. U.S. Pat. No. 4,180,775 is directed to transient current measurement; however, the device disclosed in this patent does not produce an analog time response. U.S. Pat. Nos. 3,697,911 and 4,012,703 disclose printed circuit configurations; however, neither of these patents suggest that the printed circuit configurations are of interest with respect to configuring pick-up coils, which coils are capable of monitoring flat cables without introducing extra impedance into the circuit of which the flat cable is a component.

In view of the aforementioned considerations, there is a need for a device to enable measurement of high current transient waveforms associated with low inductance circuits such as those used with capacitor discharge units, wherein the device neither introduces an unwanted ground point, nor additional inductance into the circuit being measured.

SUMMARY OF THE INVENTION

In view of the aforementioned considerations, it is an object of this invention to provide methods of, apparatus for and a probe for measurement of high current transient waveforms associated with low inductance circuits such as, for example, circuits associated with capacitor discharge units.

Upon further study of the specification and appended claims, further objects and advantages of this invention will become apparent to those skilled in the art.

In view of the aforementioned object, the instant invention contemplates an apparatus for monitoring a pair of flat cable transmission lines for transient current spikes, wherein an elongated coil is formed on one side of the substrate and the coil and substrate configured into a U-shaped article, the pair of flat cable transmission lines being received between the legs of the U-shaped article. A pair of leads extend from the coil to form a loop, around which loop a current transformer is positioned. A monitoring device is connected to the transformer through another winding.

In addition, the coil of the instant invention may be a pickup loop wherein the pickup loop is configured by an elongated conductor arranged as a flat coil which is formed on a substrate of insulating material. The substrate and coil are configured as a U-shaped article having two leg portions in opposed relation defining a space therebetween, wherein current is monitored in a pair of flat cable transmission lines by inserting the cable in the space between the legs of the U-shaped article. In order to shield the pickup from external noise, a layer of metal is formed on the other side of the substrate.

BRIEF DESCRIPTION OF THE DRAWINGS

Various other objects, features and attendant advantages of the present invention will be more fully appreciated as the same becomes better understood when considered in connection with the accompanying drawings, in which like reference characters designate the same or similar parts throughout the views, and wherein.

DESCRIPTION OF THE PREFERRED EMBODIMENTS

Figure 1:
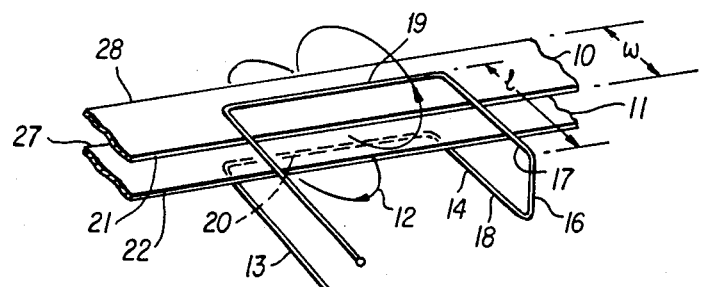
FIG. 1 is a perspective view of a flat cable transmission line and a pickup coil configured in accordance with the principles of the instant invention.

Referring now to FIG. 1, low inductance, high current circuits often use flat cable transmission lines such as the flat cable transmission lines 10 and 11 shown in FIG. 1. The flat cable transmission lines 10 and 11 may be connected with low inductance circuits such as those associated with capacitor discharge units which produce high current transient waveforms. Lines 10 and 11 create an external magnetic field 12 which is proportional to the current flowing through the lines. In accordance with the principles of the instant invention, a pickup coil designated generally by the numeral 13, is inserted into the magnetic field.

The pickup coil 13 has a U-shaped cross-section, illustrated generally by the portion 14. The U-shaped portion comprises a bight portion 16 and a pair of leg portions 17 and 18. The bight portion 16 is juxtaposed with the lateral edges 21 and 22 of the lines 10 and 11 while the opposed leg portions 17 and 18 fit over the conductors 10 and 11 of the lines. In other words, the opposed legs 17 and 18 define a space 23 within which the flat cable conductors 10 and 11 are received. In accordance with one feature of the instant invention, the legs 17 and 18 may have a length (l) less than the width (w) of the flat cables 10 and 11 so that the coil 13 does not extend completely across the flat cable lines, but rather terminates before reaching the opposite edges 27 and 28 of the lines. Coil 13 also has two sections 19 and 20 which are parallel to the cable conductors 10 and 11. Sections 19 and 20 are the portions of the pick-up coil acted on by the magnetic field 12.

The coil 13 may be made from insulated wire or fabricated as a printed circuit conductor on a polyimide sheet, as will be further explained hereinafter. The coil output voltage "e" is proportional to $Nd\phi/dt$ or, since $\phi$ is proportional to the line current, I. N is the number of turns in the coil and $\phi$ is the magnetic flux through the coil. The output coil voltage "e" equals $kN \, dI/dt$, where k is a proportionality constant. If the coil is short-circuited, the current flowing through the pickup loop will be:

$$i = \int \frac{(e - iR)}{L} dt \text{ (L and R are the loop inductance and resistance.)}$$

If iR is much less than "e", then $$i = \int \frac{e}{L} dt = \int \frac{kN}{L} \frac{dI}{dt} dt = \left(\frac{kN}{L}\right) I$$

Figure 2:
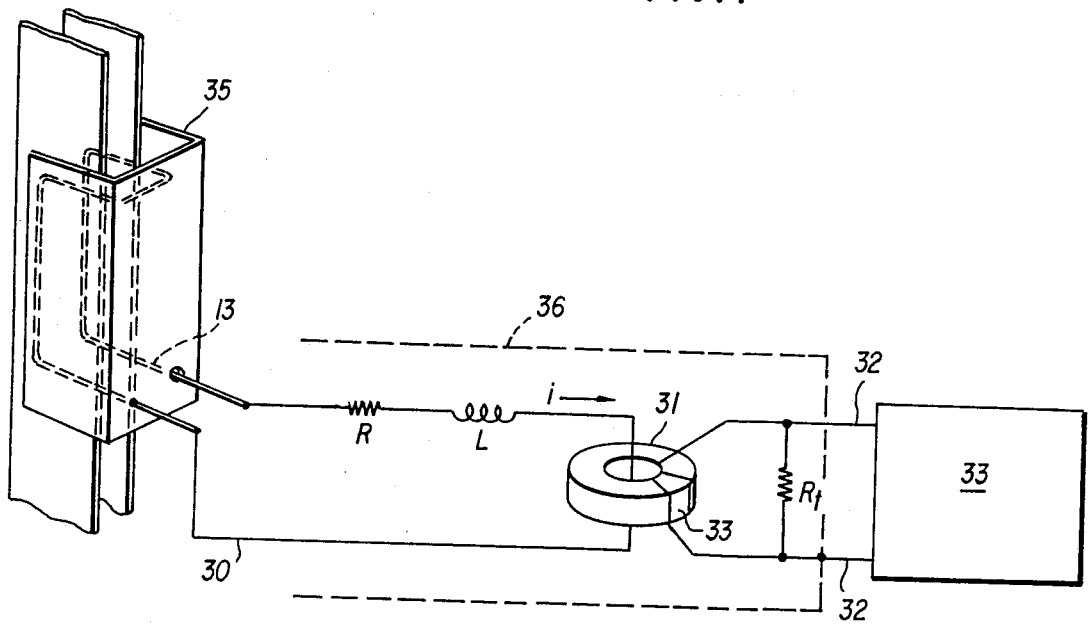
FIG. 2 is a perspective view of a pickup loop configured in accordance with the principles of the instant invention in combination with the diagrammatically illustrated current transformer.

Referring now to FIG. 2, the pickup loop current "i" flows through a loop, designated generally by the numeral 30 which loop passes through a current transformer in the form of a ferrite toroid 31. The current transformer 31 has a winding 32 looped there around at 33 which provides an isolated ground signal proportional to the current in the flat cable pair 10 and 11. In order to minimize interference from external noise, electrostatic shielding in the form of a U-shaped copper foil plate 35 is placed around the pickup coil 13 while the current transformer 31 and the elements associated therewith are surrounded by a copper shield 36. "R" and "L" represent the loop inductance and resistance which is connected in series with the transformer 31.

The output leads 32 from the transformer 31 are connected to the appropriate instrumentation 33, which in accordance with the illustrated embodiment is an oscilloscope. By utilizing an oscilloscope, an analog representation of current spikes in the flat cable conductors is created. A terminating resistor "$R_t$" is placed across the output leads 32 and must be compensated for by designing the current transformer 31 so that a negligibly small resistance is reflected back to the pickup loop circuit 30. The current transient monitoring system shown in FIG. 2 is designed primarily for high frequency, high current applications. In order to maintain adequate low frequency response, the value of the inductance "L" required in the pickup loop circuit 30 may need to be increased. Typical outputs from the circuit shown in FIG. 2 are 1–5 volts per kiloamp for a 2.5 mhz damped, sinusoidal oscillator current.

Figure 3:
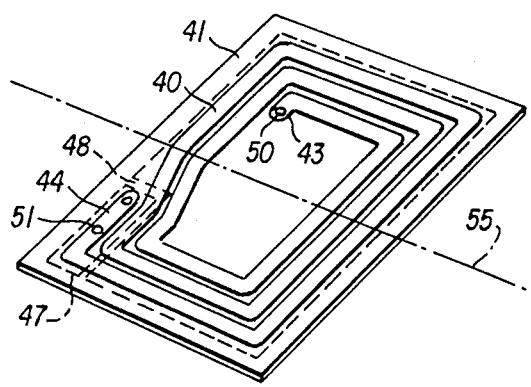
FIG. 3 is a perspective view of a printed circuit-type pickup coil configured in accordance with the principles of the instant invention.
Figure 4:
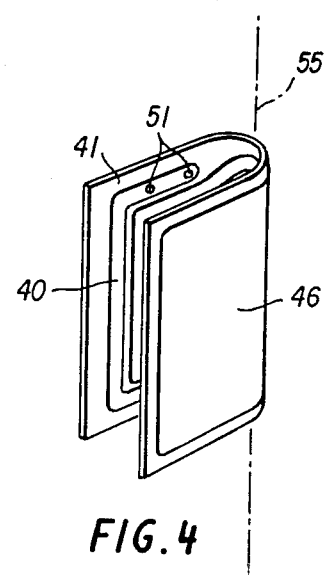
FIG. 4 is a perspective view of the pickup coil of FIG. 3 folded into a U-shape.

Referring now to FIGS. 3 and 4, wherein a preferred embodiment for the pickup coil 13 is shown. It is seen that the pickup coil is formed of copper which is deposited in a flat rectangular spiral coil, designated generally by the numeral 40, on a flexible substrate 41. The particular method of forming the coil 40 on the substrate 41 is not of particular significance with respect to this invention, it is only important that the flat coil 40 be adhered to the substrate 41. Preferably, the substrate 41 is made of a polyimide material such as KAPTON.

The coil 40 has first and second ends 43 and 44. The first end 43 is within the convolutions of the coil 40, whereas the second end 44 is external to the convolutions of the coil. It is to the ends 43 and 44 that the opposite ends of loop 30 shown in FIG. 2 are attached.

The shield 35 (see FIG. 2) which in accordance to the preferred embodiment is formed of a layer of copper foil 46 is formed on the side of substrate 41 which is opposite the side on which the flat coil 40 is formed. Accordingly, the shield 35 is electrically isolated from the flat coil 40 by the insulating material of the substrate 41. In addition to the copper foil 46 forming the shield 35 there is a copper pad 47 on the other side of substrate 41 which is aligned with the end 44 of the flat coil 40. The pad 47 is electrically separated from the material 46 of the shield 35 by a space 48. The first end 43 of the flat coil 40 is connected to the shield 35 by a plated through-hole 50. The plated through-hole 50 receives one end of the loop 30 so that the flat coil 40, the shield 35 and the loop 30 are all electrically connected to one another. At least one plated through-hole 51 extends through the second 44 of the flat coil 40 and established an electrical connection with the pad 47. The other end of the pickup loop 30 (see FIG. 2) is electrically connected to the second 44 and pad 47 by being bonded in the through-hole 47.

Referring now to FIG. 4, the "printed circuit" is formed into a pickup coil by bending the printed circuit about a fold axis 55 to form a U-shaped article such as the pickup coil 13 as shown in FIGS. 1 and 2. The fold axis 55 is selected so that the first end 43 of the flat coil 40 is on one side of the axis and the second end 44 of the flat coil is on the other side of the fold axis. The portions of coil 40 corresponding to sections 19, 20 of the single turn coil of FIG. 1 are straight and parallel to fold axis 55 and, therefore, the transmission line.

Figures 5, 6:
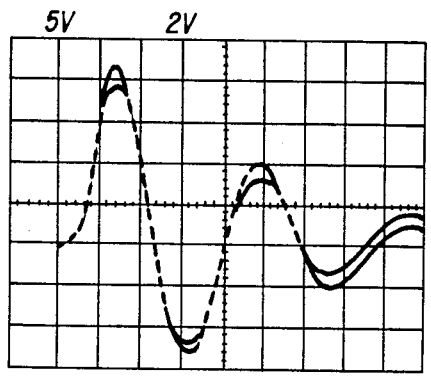
FIG. 5 is a chart comparing the performance of the instant invention to that of the prior art.
FIG. 6 is a CRT trace comparing the performance of the instant invention to the performance of the prior art.

Referring now to FIG. 5, the apparatus of FIG. 2 utilizing the pickup probe of FIGS. 3 and 4 was compared to a current viewing resistor (CVR T&M Model SDN 414-01) and to a current viewing transformer (CVT Pearson Model 411) which was mounted with a shielded braid loop connected to the flat cable output. As is seen from FIG. 5, the CVR added 0.013 ohms and 9.6 nh to cable "z" while the CVT added 0.017 ohms and 30.7 nh to cable "z". As is readily seen, the new monitor system added no measurable resistance or inductance to the cable.

Referring now to FIG. 6, where a calibrated current viewing resistor was used as a reference to check the flat cable monitor system in accordance with the instance invention, it is seen that the general wave shape is practically identical using the two systems. Accordingly, applicant's claimed invention provides an analog signal which is of the same quality as analog signals obtained from calibrated current reviewing resistors without the addition of measurable resistance or inductance to the cable being monitored.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. Apparatus for monitoring an opposed pair of flat cable transmission lines for transient current spikes, wherein the lines generate a field of magnetic flux therearound, said apparatus comprising:
   an elongated coil having a pair of output terminals, said coil being configured as a U-shaped article having a bight portion connecting a spaced pair of opposed legs, said coil being divided along said bight portion and having an equal portion on each leg, each portion including an elongated section for inducing a current signal in response to the magnetic flux from one of said cable pair, said current signals adding to create an output signal, wherein the pair of flat cable transmission lines are received between said legs of said U-shaped article;
   lead means connected to said output terminals of said coil and forming a loop;
   a current transformer coupled to said loop for generating an isolated ground signal proportional to the current in the pair of flat cable transmission lines; and
   means connected to said current transformer for detecting transient spikes in the isolated ground signal.

2. The apparatus of claim 1 wherein said U-shaped article further comprises an electrically insulating substrate, said coil being affixed to one surface of said substrate, said apparatus further including means for shielding said elongated coil from external electrical interference.

3. The apparatus of claim 2 wherein said shielding means comprises a layer of metal on the opposite side of said substrate from said coil.

4. The apparatus of claim 3 wherein one of said coil terminals contacts said layer of metal.

5. The apparatus of claim 4 wherein the legs of the "U" have a length which is less than the width of the flat cable.

6. The apparatus of claim 1 wherein the legs of the "U" have a length which is less than the width of the flat cable.

7. The apparatus of claim 1 further including a series inductor disposed between the elongated coil and current transformer.

8. The apparatus of claim 7 wherein the current transformer is a ferrite core transformer having a pair of output leads extending therefrom and wherein a terminating resistor is connected across the pair of leads connecting the transformer to the detecting means.

9. The apparatus of claim 3 wherein said coil is formed of more than one convolution arranged as a rectangular spiral on said substrate, the portions of said coil forming the elongated sections acted on by the magnetic flux being straight and parallel to the transmission line.

10. The apparatus of claim 1 further including means for electrically connecting one of said terminals to said layer of metal directly through said substrate;
    a pad of metal on the opposite side of said substrate and aligned with the other of said terminals, said pad being spaced from said metal layer; and
    means for electrically connecting the other of said terminals to said pad directly through said substrate, whereby said terminals are electrically accessible for connection to said loop.

* * * * *